United States Patent [19]
Takemoto et al.

[11] Patent Number: 5,093,835
[45] Date of Patent: Mar. 3, 1992

[54] SEMICONDUCTOR LASER DEVICE

[75] Inventors: Akira Takemoto; Hitoshi Watanabe; Masatoshi Fujiwara; Syoichi Kakimoto, all of Itami, Japan

[73] Assignee: Mitsubishi Denki Kabushiki Kaisha, Japan

[21] Appl. No.: 510,839

[22] Filed: Apr. 18, 1990

[30] Foreign Application Priority Data

Jun. 30, 1989 [JP] Japan ................. 1-170469

[51] Int. Cl.$^5$ .............................. H01S 3/19
[52] U.S. Cl. ..................... 372/45; 372/46; 372/96
[58] Field of Search ............. 372/96, 45, 46

[56] References Cited

U.S. PATENT DOCUMENTS

| 4,843,032 | 6/1989 | Tokuda et al. | 372/45 |
| 4,894,835 | 1/1990 | Uomi et al. | 372/96 |
| 4,941,148 | 7/1990 | Yoshida et al. | 372/96 |

FOREIGN PATENT DOCUMENTS 62-173786  7/1987  Japan .

OTHER PUBLICATIONS

"Proposal and Fabrication . . . Diode", Japanese Association of Applied Physics, Autumn 1988, p. 834.

Primary Examiner—Georgia Epps
Attorney, Agent, or Firm—Leydig, Voit & Mayer

[57] ABSTRACT

A semiconductor laser device having an active layer sandwiched by semiconductor layers having larger energy band gaps than that of the active layer, includes a semiconductor absorption layer having an energy band gap no larger than that of the active layer and having a thickness periodically changing in the cavity length direction of the resonator close to the active layer so that light which is generated at the active layer reaches the absorption layer, and a semiconductor refractive index matching layer having a larger energy band gap than that of the active layer and a higher refractive index than those of the semiconductor layers sandwiching the active layer to make the equivalent refractive indices in layer thickness direction substantially equal along the resonator direction.

4 Claims, 4 Drawing Sheets

SEMICONDUCTOR LASER DEVICE

FIELD OF THE INVENTION

The present invention relates to a semiconductor laser device and production method therefor and, more particularly to a gain coupling type distributed feedback type semiconductor laser device having no reflectance periodicity of in the resonator direction.

BACKGROUND OF THE INVENTION

FIG. 3 is a cross-sectional side view of a prior art semiconductor laser device which is disclosed in Vol. 3 of prescript of the 49th Study Meeting of Applied Physics, p. 834. In FIG. 3, a semiconductor substrate 11 of a first conductivity type is provided at the bottom of the device. A first conductivity type cladding layer 12 and an undoped active layer 13 are successively provided on the substrate 11. On the layer 13, there is provided a second conductivity type semiconductor layer having an energy band gap wider than the active layer 13 (hereinafter referred to as "a barrier layer", for it acts as a potential barrier against carriers injected into the active layer 13), and a second conductivity type semiconductor layer 15 with an energy band gap as wide as the active layer 13 (hereinafter referred to as "an absorption layer", for it absorbs light). Reference numeral 16 designates a diffraction grating produced on the surface of the absorption layer 15. On the layer 15, a second conductivity type cladding layer 17 is provided.

The operating principle of this device will be described.

According to Journal of Applied Physics, vol. 43, pp. 2327 to 2335 (1972), when the reflectance n and the gain $\alpha$ have a periodicity in the cavity length direction of the laser resonator (hereinafter referred to as "Z direction"), as represented by;

$$n(z) = n_0 + n_1 \cdot \cos(2\pi z/\Lambda)$$

$$\alpha(z) = \alpha_0 + \alpha_1 \cdot \cos(2\pi z\Lambda)$$

(herein $\Lambda$ is a pitch of a diffraction grating), the coupling coefficient $\kappa$ is defined by;

$$\kappa = n_1/\lambda + i \cdot \alpha_1/2$$

where $\lambda$ is the oscillation wavelength and i is the imaginary number unit.

In a case where $\pi n_1/\lambda >> \alpha_1/2$, i.e., the refractive index controls the coupling coefficient $\kappa$, the device is called a refractive index coupling type distributed feedback semiconductor laser device. Herein, the laser device oscillates ordinarily at two wavelengths. Such laser device has problems such as noise generated by mode competition of two wavelengths and deterioration of signal waveforms by wavelength dispersion within an optical fiber. In order to prevent these, a laser device which oscillates at a single wavelength is fabricated by increasing the reflectance of one facet of a laser resonator and lowering the reflectance of the other facet, or by shifting the phase of a diffraction grating by $\pi$ at the center portion of the resonator. In these methods, however, there are problems in the stability of oscillation at a single wavelength or in fabrication.

In a case where $\pi n_1/\lambda << \alpha_1/2$, i.e., the gain controls the coupling coefficient $\kappa$, the device is called a gain coupling type distributed feedback semiconductor laser device. Herein, the device oscillates at a single wavelength only by coating both facets of the resonator to be of low reflectance, and is superior to the refractive index coupling type one in fabrication and stability of oscillation at a single wavelength.

FIG. 3 shows a gain coupling type laser device based upon the above described ideas. Herein, an active layer 13 has the gain necessary for laser oscillation. An absorption layer 15 having an energy band gap as wide as that of the active layer 13 has a high absorption coefficient for a guided light wave, and furthermore a large periodic of absorption is produced inside the cavity because a diffraction grating is produced on the layer 15. As the absorption is only the inverse of the gain, a large periodic gain results, thereby providing a gain coupling type semiconductor laser device.

In the prior art semiconductor laser device, however, the refractive index of the absorption layer 15 and that of the second conductive type cladding layer 17 are different from each other, and this brings about the periodic of refractive index. Thus, the condition of $\pi n_1/\lambda << \alpha_1/2$ is not satisfied, and it is difficult to produce stable single mode oscillations.

SUMMARY OF THE INVENTION

An object of the present invention is to provide a gain coupling type semiconductor laser device producing stable single mode oscillations satisfying the condition of $\pi n_1/\lambda << \alpha_1/2$.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, in a semiconductor laser device, an absorption layer having a thickness changing periodically in the cavity length direction of the resonator, and having an energy band gap as wide as or narrower than that of the active layer is provided near the active layer. In addition, a plurality of refractive index matching layers are provided, which have a wider energy band gap than that of the active layer and a higher refractive index than that of the cladding layer and are arranged to avoid a periodic refractive index. Therefore, the condition $\alpha n_1/\lambda << \alpha_1/2$ is satisfied, and a semiconductor laser device which oscillates at a stable single mode is obtained.

According to a second aspect of the present invention, in providing a semiconductor laser device of above-described construction, a refractive index matching layer is produced by selective growth using the same mask which is used to produce an absorption layer as a mask. Therefore, a semiconductor laser device of above-described construction can be easily provided.

According to a third aspect of the present invention, in providing a semiconductor laser device of above-described construction, an absorption layer, the thickness of which changes periodically in the cavity length direction of the resonator, is produced by cutting a groove to penetrate the absorption layer and to reach the lower layer of the absorption layer, and then a refractive index matching layer is produced to bury this groove. Therefore, a semiconductor laser device of above-described construction can be easily provided.

DETAILED DESCRIPTION OF THE PREFERRED EMBODIMENT

An embodiment of the present invention will be described in detail with reference to the drawings.

Figure 1:
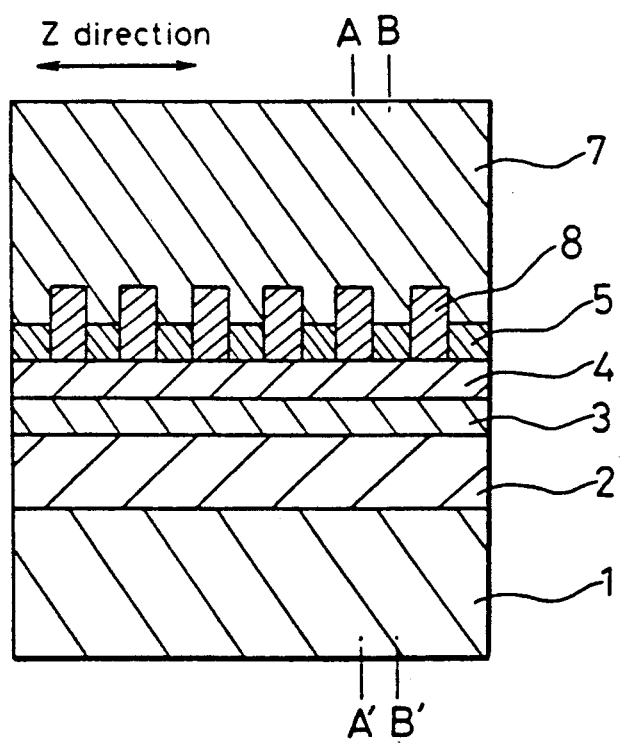
FIG. 1 is a cross-sectional side view showing a semiconductor laser device according to a first embodiment of the present invention.

FIG. 1 is a cross-sectional side view showing a semiconductor laser device according to a first embodiment of the present invention. In FIG. 1, a p type InP substrate 1 is provided at the bottom of the device. A p type InP cladding layer 2, an $In_{0.58}Ga_{0.42}As_{0.9}P_{0.1}$ active layer 3 and an n type InP barrier layer 4 are successively provided on the substrate 1. On the barrier layer 4, there is provided an n type $In_{0.58}Ga_{0.42}As_{0.9}P_{0.1}$ absorption layer 5 having an energy band gap as wide as the active layer 3 and an n type $In_{0.72}Ga_{0.28}As_{0.6}P_{0.4}$ layer 8 having a wider energy band gap than the active layer 3 and higher refractive index than that of the cladding layer 2 (hereinafter referred to as "a refractive index matching layer", for it matches the refractive index). An n type InP cladding layer 7 is disposed on the absorption layer 5 and refractive index matching layer 8.

The device operates as follows.

When a current is injected, the active layer 3 generates light and has a uniform gain in the cavity length direction of the resonator (in z direction in the drawing). The light generated in the active layer 3 transits in the z direction, and the electric field of the light is broadened due to the absorption layer 5 having an energy band gap as wide as the active layer 3, whereby the light is absorbed by absorption layer 5. The absorption layer 5 is produced periodically in the cavity length direction of the resonator. The refractive index matching layers 8, alternating periodically with the absorption layer 5, hardly absorb the light because its energy band gap is wider than the active layer 3, thereby producing a periodic gain.

Description is given of the periodicity of the refractive index as follows. The active layer 3 and the absorption layer 5 have refractive indices higher than the cladding layers 2 and 7. Consequently, when only the thickness of the absorption layer 5 is changed without providing the refractive index of matching layer 8, the equivalent refractive index is changed at the thick portions and the thin portions of the absorption layer 5. Therefore, when a refractive index matching layer is not provided, a periodicity of the refractive index arises. To prevent this, a refractive index matching layer 8 with a refractive index higher than that of the cladding layers 2 and 7 is provided in this embodiment of the present invention. Generally, a semiconductor with a wide energy band gap has a refractive index lower than that of a semiconductor with a narrow energy band gap. Therefore, perfect refractive index matching is herein accomplished by making the layer thicker.

The refractive index and the thickness of the refractive index matching layer are related as follows. The refractive index for the guided light of the layers in a multi-layer construction can be, if the thickness and the refractive index of the respective layers are specified, fundamentally obtained as an equivalent refractive index. Therefore, a periodic refractive index can be prevented by specifying the refractive index and the thickness of the refractive index matching layer 8 so that the equivalent refractive index at the portion where the refractive index matching layer 8 is produced, i.e., the portion of A—A' line in FIG. 1, is equal to that at the portion where the absorption layer 5 is produced, i.e., the portion of B—B' line.

Thus, in the embodiment of the present invention, an absorption layer having an energy band gap as wide as the active layer and having a thickness changing periodically in the cavity length direction of the resonator, is provided on the barrier layer produced on the active layer with a wider energy band gap than the active layer, and a refractive index matching layer having a wider energy band gap than the active layer and having a higher refractive index than that of the cladding layer is arranged to compensate for and effectively eliminate the periodicity of refractive index, whereby a semiconductor laser device having no periodic refractive index but a periodic gain is obtained.

Description is given of the processes for producing these embodiments as follows.

FIG. 4(a) to 4(d) are cross-sectional views illustrating a process for producing the semiconductor laser device shown in FIG. 1. In FIG. 4, the same reference numerals designate the same or corresponding elements as those shown in FIG. 1. Reference numeral 9 designates an etching mask.

Figure 4A:
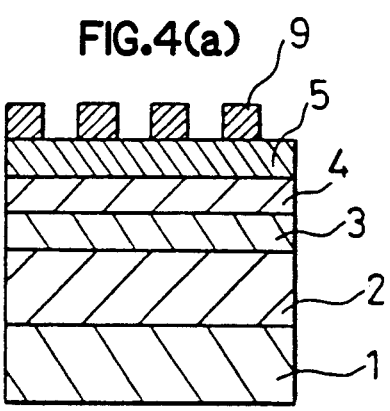
FIGS. 4(a) to 4(d) are cross-sectional side views illustrating a process for producing the embodiment of the invention shown in FIG. 1.
Figure 4B:
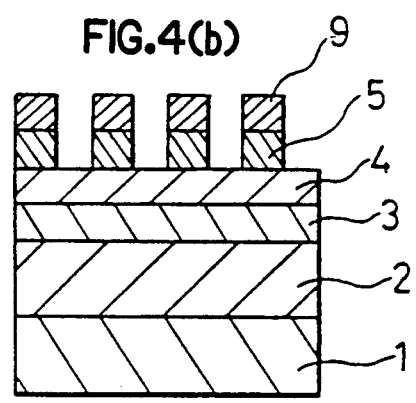
Figure 4C:
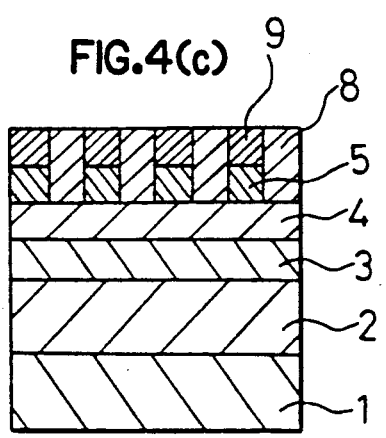
Figure 4D:
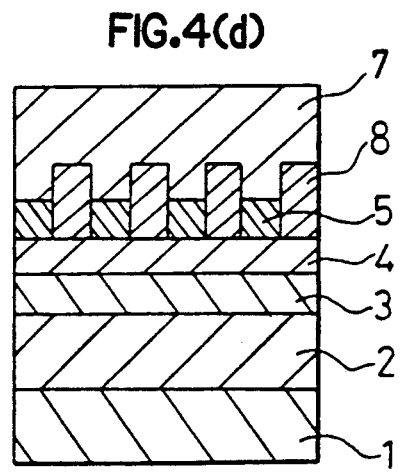

In the initial state, a p type InP cladding layer 2 having a thickness of 2 microns, an $In_{0.58}Ga_{0.42}As_{0.9}P_{0.1}$ active layer 3 having a thickness of 0.13 micron, an n type InP barrier layer 4 having a thickness of 0.1 micron and an n type $In_{0.58}Ga_{0.42}As_{0.9}A_{0.1}$ absorption layer 5 having a thickness of 0.02 micron are expitaxially grown on p type InP substrate 1, and then a $SiO_2$ etching mask 9 is produced. The interval between stripes of etching mask 9 is 2400 angstroms. Thereafter, as shown in FIG. 4(b), absorption layer 5 is etched using the etching mask 9 as a mask. Subsequently, as shown in FIG. 4(c), an n type $In_{0.72}Ga_{0.28}As_{0.6}P_{0.4}$ refractive index matching layer 8 is selectively grown by MOCVD. The thickness of refractive index matching layer 8 is 0.36 micron when the layer thickness and composition of the other layers are the same as in the above-described embodiments, whereby the refractive index is matched. Lastly, the etching masks 9 are removed, and as shown in FIG. 4(d), an n type InP cladding layer 7 having a thickness of 1 micron is grown, thereby completing a semiconductor laser device.

Figure 2:
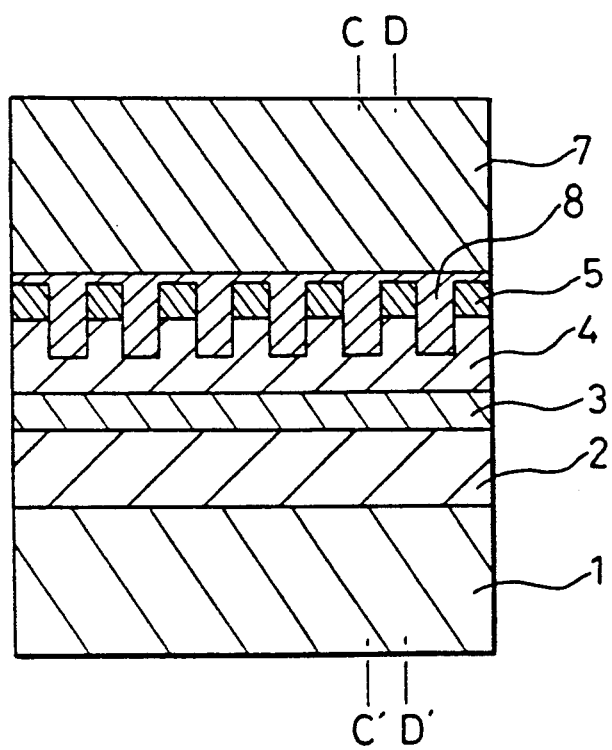
FIG. 2 is a cross-sectional side view showing a semiconductor laser device according to a second embodiment of the present invention.
Figure 3:
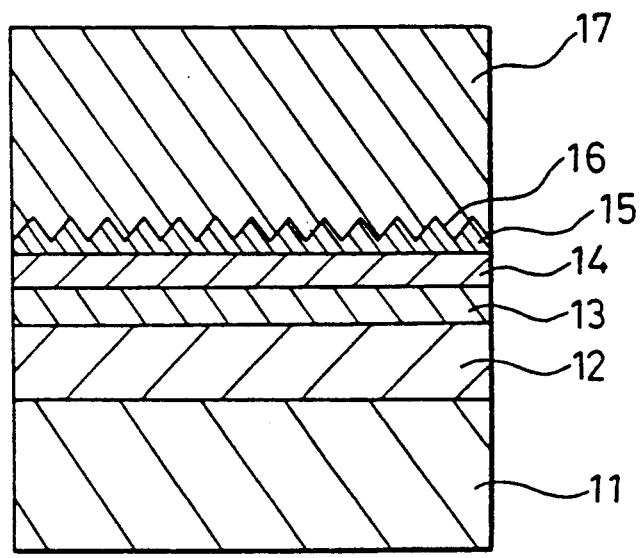
FIG. 3 is a cross-sectional side view showing a prior art semiconductor laser device.

FIG. 2 is a cross-sectional view showing a semiconductor laser device according to another embodiment of the present invention. In FIG. 2, the same reference numerals designate the same or corresponding elements as those shown in the embodiment of FIG. 1.

This embodiment operates on the basis of the same principle as in FIG. 1. In this embodiment, the refractive indices and the thicknesses of respective layers are established so that the equivalent refractive index along line C —C' and that along line D—D' in FIG. 2 are equal to each other.

Figure 5A:
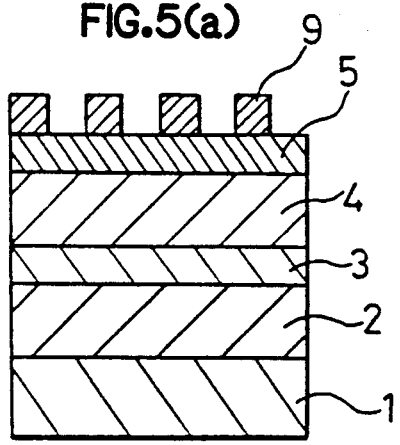
FIGS. 5(a) to 5(c) are cross-sectional side views illustrating another process for producing the second embodiment of the invention shown in FIG. 2.

The production method of a semiconductor laser device shown in FIG. 2 is illustrated with reference to FIG. 5. In FIG. 5, the same reference numerals designate the same or corresponding elements as those shown in FIG. 4.

Figure 5B:
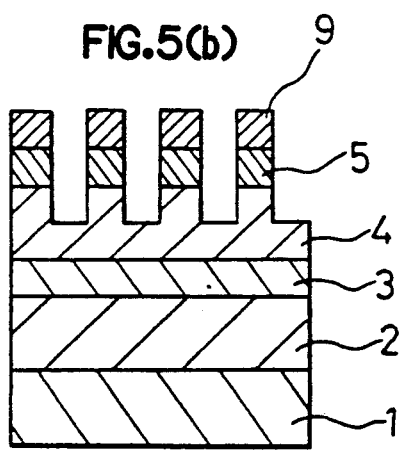
Figure 5C:
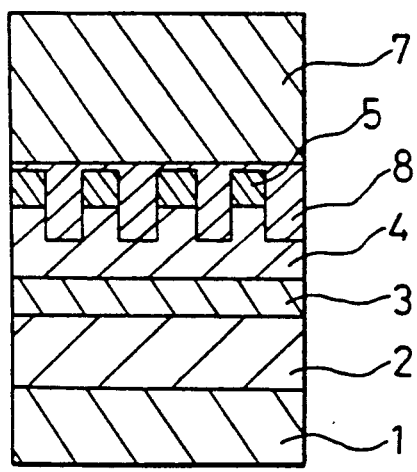

In the initial state, a cladding layer 2, an active layer 3, a barrier layer 4, and an absorption layer 5 are successively produced on the substrate 1, and thereafter, etching mask 9 is formed thereon. Then, as shown in FIG. 5(b), grooves are etched using the etching mask 9 to reach the barrier layer 4 by penetrating the absorption layer 5. Subsequently, as shown in FIG. 5(c), a refractive index matching layer 8 is grown to bury the etched grooves, and a cladding layer 7 is grown, thereby completing a semiconductor laser device.

In the above-described embodiment the absorption layer 5 is a rectangular configuration, but it may be a triangular or another configuration so long as the refractive index is matched by the refractive index matching layer.

In the above-described embodiment, both the absorption layer 5 and the refractive index matching layer 8 are of second conductivity type, but one of them may be of a first conductivity type.

In the above-described embodiment the absorption layer 5 and the refractive index matching layer 8 are produced above the active layer 3, but one or both of them may be produced below the active layer 3.

As is evident from the foregoing description, according to the first aspect of the present invention, a refractive index matching layer is produced to suppress the periodicity of the refractive index. Therefore, a gain coupling type semiconductor laser device oscillating at a stable single wavelength is obtained.

According to the second aspect of the present invention, the above-described refractive index matching layer is produced by selective growth using a mask which is used to produce the absorption layer. Therefore, a semiconductor laser device of above-described construction can be easily provided.

According to the third aspect of the present invention, the refractive index matching layer is produced to bury grooves which penetrate the absorption layer of in making periodicity in the thickness of the absorption layer. Therefore, a semiconductor laser device of above-described construction can be easily produced.

What is claimed is:

1. In a semiconductor laser device, a structure comprising:
    a semiconductor active layer extending along a resonator length direction of the laser and having an energy band gap;
    first and second semiconductor layers sandwiching said active layer and having larger energy band gaps than said active layer and first and second refractive indices, respectively;
    a semiconductor absorption layer having an energy band gap no larger than that of said active layer and a thickness measured along a thickness direction generally perpendicular to the resonator length direction, the thickness of said absorption layer being periodic in the resonator length direction, said absorption layer being disposed adjacent said second semiconductor layer for receiving light generated at said active layer; and
    a semiconductor refractive index matching layer having an energy band gap larger than that of said active layer and a third refractive index higher than the first and second refractive indices, said refractory index matching layer being disposed adjacent said absorption layer and said second semiconductor layer in sufficient thickness to produce a substantially constant equivalent refractive index adjacent said second semiconductor layer in the thickness direction along the resonator length.

2. The semiconductor laser device structure as defined in claim 1, wherein said absorption layer comprises $In_xGa_{1-x}As_yP_{1-y}$ and said refractive index matching layer comprises $In_mGa_{1-m}As_nP_{1-n}$ wherein $x<m$ and $y>n$.

3. The semiconductor laser device structure as defined in claim 1 wherein the thickness of at least one of said absorption and refractive index matching layers is periodically zero along the resonator length.

4. The semiconductor laser device structure as defined in claim 1 wherein at least one of said light absorption and refractive index matching layers comprises a plurality of discontinuous regions, said light absorption and refractive index matching layers being alternatingly disposed along the resonator length.

* * * * *